US006305946B1

(12) United States Patent
McHugh et al.

(10) Patent No.: US 6,305,946 B1
(45) Date of Patent: Oct. 23, 2001

(54) POWER CONNECTOR COMBINING SIGNAL CONNECTION

(75) Inventors: Robert G. McHugh, Evergreen, CO (US); Wen-Chun Pei, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/574,669

(22) Filed: May 18, 2000

(51) Int. Cl.[7] .............................. H01R 12/00; H05K 1/00
(52) U.S. Cl. .............................................................. 439/60
(58) Field of Search .................................... 439/591, 637, 439/60, 108

(56) References Cited

U.S. PATENT DOCUMENTS 4,881,904 * 11/1989 Ammon et al. ........................ 439/78
5,688,146 * 11/1997 McGinley et al. ................... 439/637

* cited by examiner

*Primary Examiner*—Brian Sircus
*Assistant Examiner*—Chandrika Prasad
(74) *Attorney, Agent, or Firm*—Wei Te Chung

(57) ABSTRACT

A power connector including an insulative housing defining an elongate slot in a front face thereof for receiving a central processing unit (CPU) module therein and pairs of upper and lower passages in an opposite face thereof in communication with the slot for receiving power contact pairs that electrically engage the CPU module. Each pair of power contacts includes a ground terminal and a hot terminal respectively received in the upper and lower passages. Each pair of ground and hot terminals have tail sections extending beyond the rear face and offset toward each other for securely receiving and electrically engaging a capacitor board to supply electrical power to the CPU module. Each lower passage is elongated in a direction away from the corresponding upper passage for providing an additional space to receive and retain a signal contact. Each signal contact has a tail section extending beyond the rear face for being electrically connected to a flat cable for exchange of data and control signals. Each signal contact has a U-shaped engaging section located in the slot and extending toward the CPU module for electrically engaging the CPU module and providing resiliency.

13 Claims, 4 Drawing Sheets

POWER CONNECTOR COMBINING SIGNAL CONNECTION

BACKGROUND OF THE INVENTION

1. Field of the Invention

The present invention generally relates to an electrical connector for connecting an integrated circuit (IC) module, such as a central processing unit (CPU) module, to a power source.

2. The Prior Art

With the development of electronic industry, operation speed of CPUs is significantly increased. To support such a speedy operation, an independent power supply may be required for supplying stable electrical power to the CPU. Furthermore, to ensure a continuous supply of power, the mechanical structure of the power connector must be reliable. A lot of different connectors having complicated structures are available in the market. Such connectors may be modified to serve as a power connector. However, such complicated structures make them unreliable as compared to connectors having a simple structure. An example of the complicated power connectors is disclosed in the co-pending U.S. patent application Ser. No. 09/549,155 filed on Apr. 13, 2000 and assigned to the assignee of the present invention.

Furthermore, exchange of signals, including data and commands, between a CPU and other components of a computer also requires a connection between the CPU and the components. It is preferable to combining the signal connection in the power connector for reducing the amount of space occupied thereby.

It is thus desired to provide a power connector overcoming the problems discussed above.

SUMMARY OF THE INVENTION

Accordingly, an object of the present invention is to provide a power connector having a simple and reliable structure for ensuring stable and continuous supply of electrical power to a CPU module.

Another object of the present invention is to provide a power connector in which a signal connector is incorporated for signal exchange between a CPU module and related components of an electronic device.

To achieve the above objects, a power connector in accordance with the present invention comprises an insulative housing defining an elongate slot in a front face thereof for receiving a central processing unit (CPU) module therein and pairs of upper and lower passages in an opposite face thereof in communication with the slot for receiving power contact pairs that electrically engage the CPU module. Each pair of power contacts includes a ground terminal and a hot terminal respectively received in the upper and lower passages. Each pair of ground and hot terminals have tail sections extending beyond the rear face and offset toward each other for securely receiving and electrically engaging a capacitor board to supply electrical power to the CPU module. Each lower passage is elongated in a direction away from the corresponding upper passage for providing an additional space to receive and retain a signal contact. Each signal contact has a tail section extending beyond the rear face for being electrically connected to a flat cable for exchange of data and control signals. Each signal contact has a U-shaped engaging section located in the slot and extending toward the CPU module for electrically engaging the CPU module and providing resiliency.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
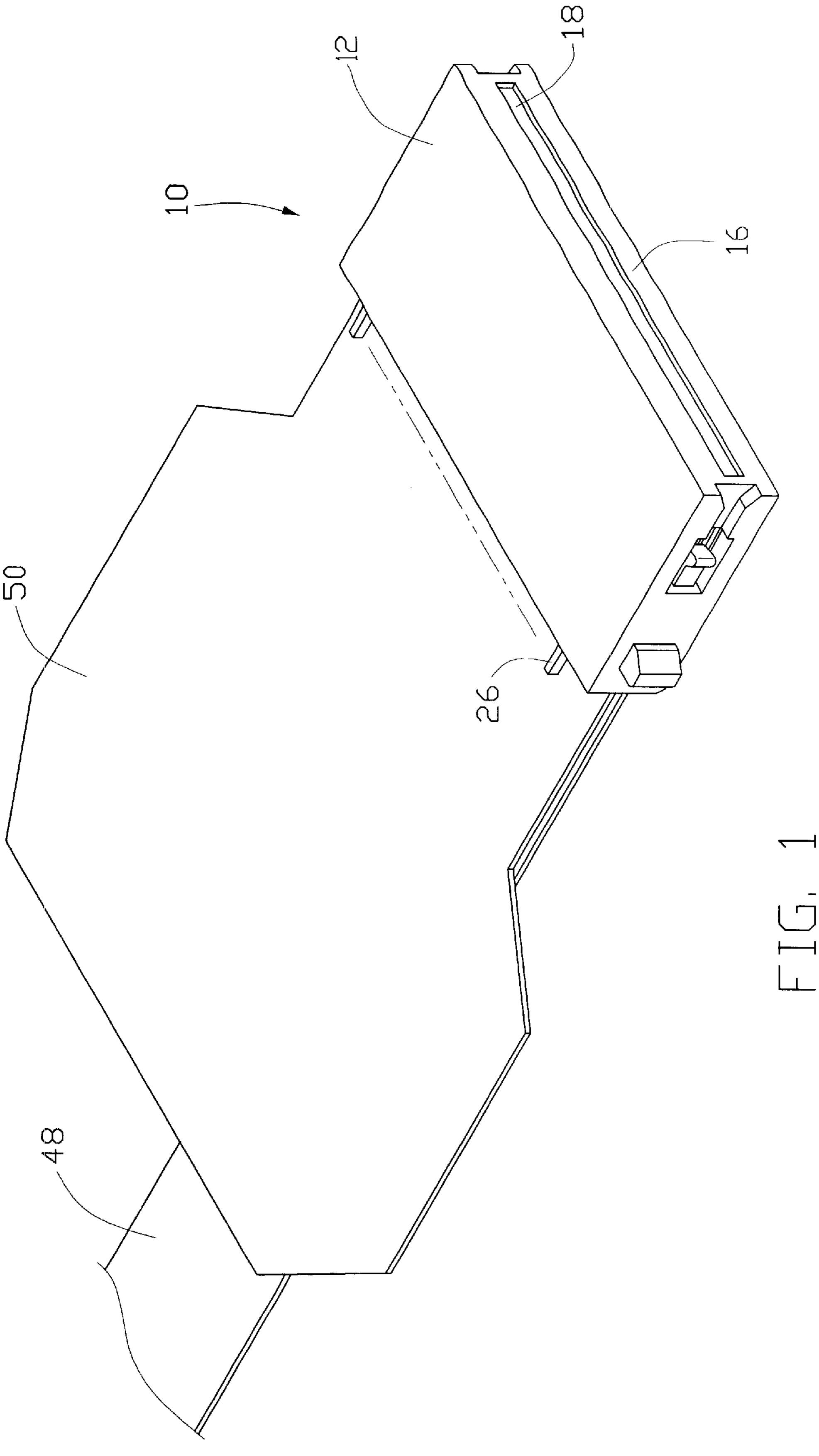
FIG. 1 is a perspective view of a power connector constructed in accordance with the present invention with a capacitor board and a flexible circuit board connected thereto.
Figure 2:
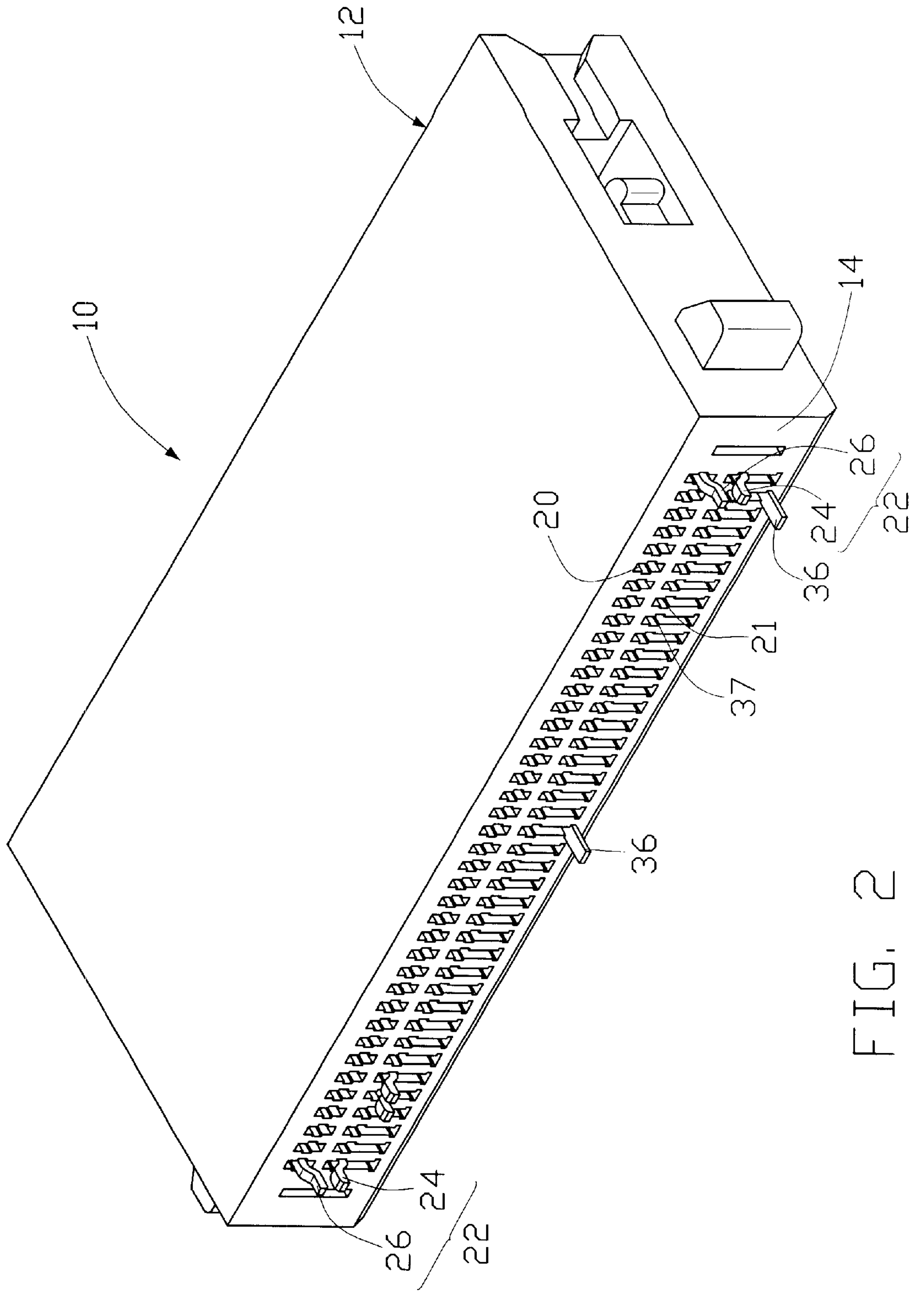
FIG. 2 is a rear perspective view of the power connector of the present invention.

Referring to the drawings and in particular to FIGS. 1 and 2, a power connector 10 constructed in accordance with the present invention comprises an insulative housing 12 having a rear face 14 and an opposite front face 16. An elongate slot 18 is defined in the housing 12 exposed to the front face 16 for receiving an edge of an integrated circuit (IC) module (not shown), such as a central processing unit (CPU) module. Pairs of upper 20 and lower 21 passages are defined in the housing 12 exposed to the rear face 14 and in communication with the slot 18.

Figure 3:
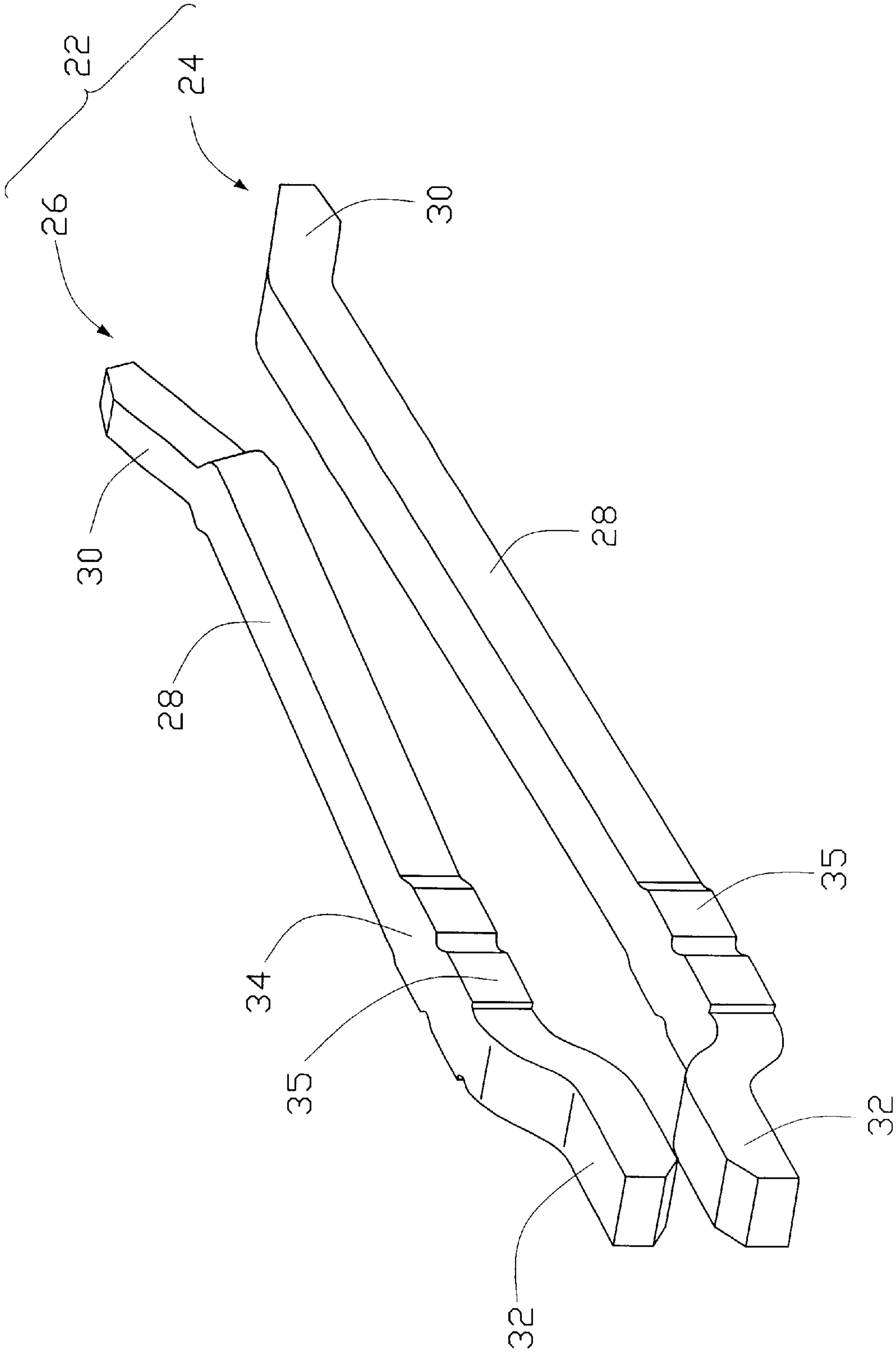
FIG. 3 is a perspective view of a pair of power contacts of the power connector.

Also referring to FIG. 3, pairs of power contacts 22, each including a hot terminal 24 and a ground terminal 26, are received and retained in the lower and upper passages 21, 20. Each terminal 24, 26 has an elongate body 28 having a front end forming an inclined engaging section 30 extending into the slot 18 for electrically engaging the CPU module and a rear end forming an offset tail section 32. A retention section 34 is formed between the body 28 and the tail section 32 for interferentially engaging with the housing 12, preferably by means of two pair of protrusions 35. The engaging sections 30 of each pair of power contacts 22 diverge from each other to define a wide opening therebetween for facilitating receiving the CPU module.

A commonly available CPU module comprises a printed circuit board on which a CPU chip and memory chips, known as cache memory, are mounted. An edge of the printed circuit board, on which conductive traces are formed, is received between the power contacts 22 for engagement of the power contacts 22 with the conductive traces. To power both the CPU and the memory, the power contacts 22 are divided into two groups respectively associated with the CPU and the memory. In the embodiment illustrated, there are forty (40) pairs of power contacts 22 of which thirty-five pairs are designated for powering the CPU while the remaining five pairs power the memory of the CPU module.

Figure 4:
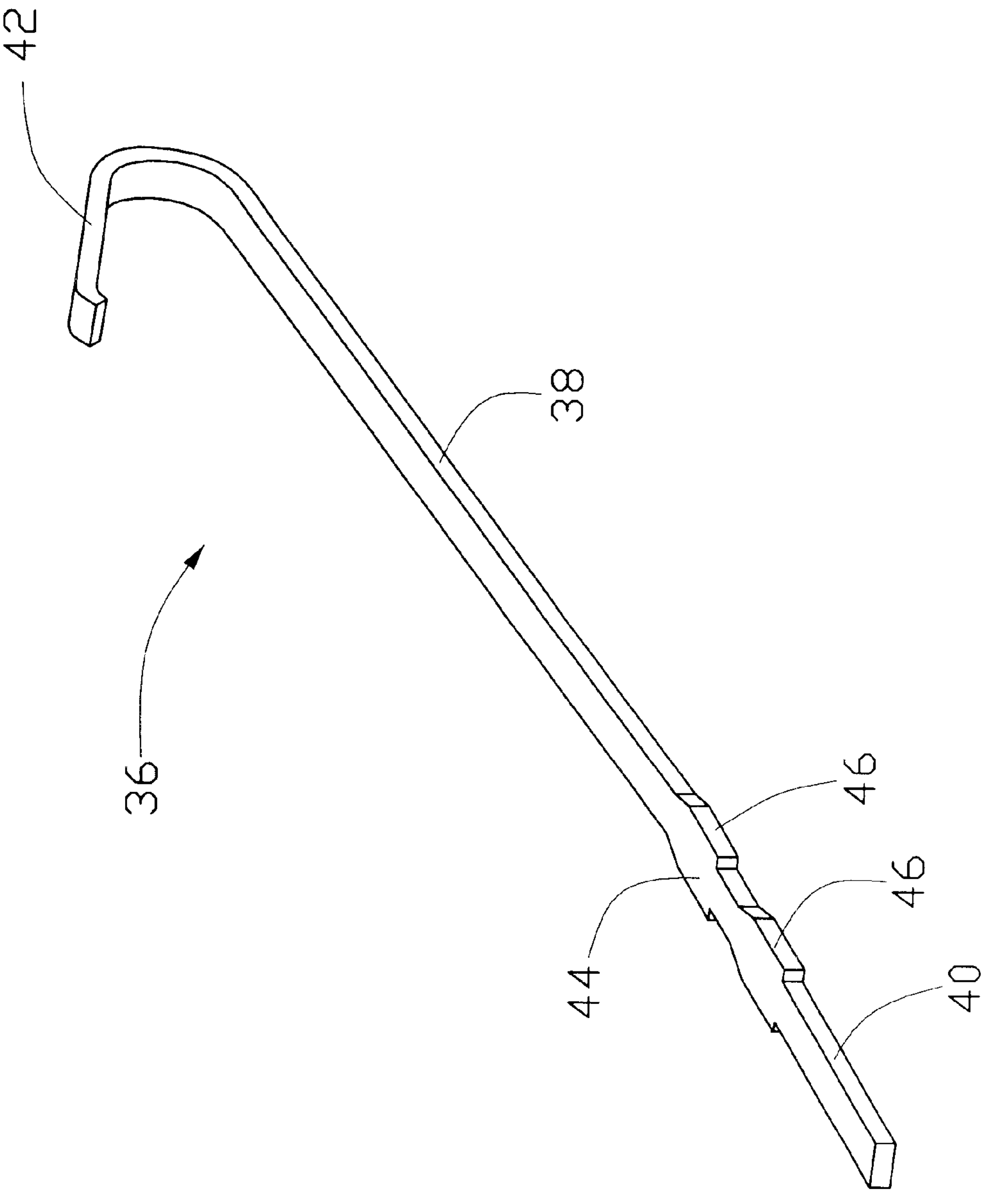
FIG. 4 is a perspective view of a signal contact of the power connector.

Also referring to FIG. 4, to provide data and command signal exchange between the CPU module and other component of an electronic device, signal contacts 36 are also retained in the power connector 10. The lower passages 21 are elongated in a direction away from the corresponding upper passages 20 for forming an additional space to receive the signal contacts 36 whereby the signal contacts 36 are located below and spatially separated from the hot terminals 24 of the power contacts 22. It is noted that to ensure the separation between the signal contacts 36 and the hot terminals 24, shoulders 37 are defined in each lower passage 21 for supporting the hot terminal 24 spaced from the signal contact 36.

In the embodiment illustrated, there are nineteen (19) signal contacts 36 occupying nineteen of the forty lower passages 21. It should be noted that to avoid unnecessary confusion and complication of the drawings, only the first and last ones of the grounding terminals 26, the hot terminals 24 and the signal contacts 36 are shown in FIG. 2. The remaining terminals 26, 24 and signal contacts 36 are omitted.

Each signal contact 36 comprises an elongate body 38 having a rear end forming a tail section 40 and a front end forming a U-shaped engaging section 42 extending into the slot I18 for engaging the CPU module. A retention section 44 is formed between the tail section 40 and the body 38 for interferentially engaging the housing 12, preferably by means of two pairs of protrusions 46. The U-shaped engaging section 42 is located in the slot 16 and extends toward the CPU module for eliminating the spatial distance between each signal contact 36 and the associated hot terminal 24 whereby the hot terminals 24 and the signal contacts 36 may engage the CPU module simultaneously. The U-shape 42 of the signal contact 36 also provides a resiliency for ensuring engagement between the signal contact 36 and the printed circuit board of the CPU module.

It should be noted to avoid unnecessary mechanical interference between the signal contacts 36 and the hot terminals 24, the body 38 of each signal contact 36 may be longer than the body 28 of the corresponding hot terminal 24 whereby an engagement point between the CPU module and the hot terminal 24 is different from and separated from an engagement point between the corresponding signal contact 36 and the CPU module.

Referring back to FIGS. 1 and 2, the tail sections 32, 40 of the power contacts 22 and the signal contacts 36 extend beyond the rear face 14 of the housing 12. A flexible circuit board or a flexible flat cable 48 is soldered to or otherwise electrically and mechanically connected to the tail sections 40 of the signal contacts 36 for providing connection between the signal contacts 36 and the other component of the electronic device.

A capacitor board 50 has a multi-layered structure comprising a central dielectric layer sandwiched between two conductive layers (both not shown) is connected to the power contacts 22 by having an inner edge thereof interferentially received and interposed between the tail sections 32 of the ground terminals 26 and the hot terminals 24. The offset configuration of the tail sections 32 ensures a secure initial engagement between the power contacts 22 and the capacitor board 50. Soldering may then be applied to the tail sections 32 and the capacitor board 50 for fixing the capacitor body 50 to the power contacts 22.

The capacitor board 50 may define a plurality of through holes (not shown) for mounting thereon capacitors (not shown). The capacitors serve to stabilize power supply to the power contacts 22.

Although the present invention has been described with reference to the preferred embodiment, it is apparent to those skilled in the art that a variety of modifications and changes may be made without departing from the scope of the present invention which is intended to be defined by the appended claims.

What is claimed is:

1. A power connector comprising:

an insulative housing having a front face and an opposite rear face, an elongate slot being defined in the housing exposed to the front face, pairs of upper and lower passages being defined in the housing exposed to the rear face, the passages being in communication with the elongate slot, each lower passage being enlarged as compared to the upper passage to include an additional space;

power contact pairs received and retained in the passages, each pair of power contacts including a ground terminal received in the upper passage and a hot terminal received in the lower passage, each terminal comprising a body having a first end forming an engaging section extending into the slot and a second end forming a tail section extending beyond the rear face; and signal contacts received and retained in the additional spaces of the lower passages, each signal contact comprising a body having a first end forming an engaging section and a second end forming a tail section extending beyond the rear face.

2. The power connector as claimed in claim 1, wherein the lower passages are elongated in a direction away from the corresponding upper passages, the signal contacts being located below and spaced from the hot terminals, the engaging sections of the signal contacts being U-shaped.

3. The power connector as claimed in claim 1, wherein each of the terminals and the signal contacts comprises a retention section formed between the tail section and the body for interferentially engaging with the housing.

4. The power connector as claimed in claim 3, wherein the retention section comprises two pairs of protrusions interferentially engaging the housing.

5. The power connector as claimed in claim 1 further comprising a flexible circuit board electrically connected to the tail sections of the signal contacts.

6. The power connector as claimed in claim 5, wherein the flexible circuit board is soldered to the tail sections of the signal contacts.

7. The power connector as claimed in claim 1 further comprising a capacitor board electrically connected to the tail sections of the power contacts.

8. The power connector as claimed in claim 7, wherein the tail sections of the ground and hot terminals of the power contacts are offset toward each other for interferentially receiving the capacitor board therebetween.

9. The power connector as claimed in claim 8, wherein the capacitor board is soldered to the tail sections of the power contacts.

10. The power connector as claimed in claim 2, wherein the body of each signal contact has a length greater than the body of each hot terminal of the power contacts.

11. The power connector as claimed in claim 1, wherein the signal contacts has a number smaller than that of the power contacts.

12. A power connector comprising:

an insulative housing having opposite front and rear faces, and an elongate slot defined therein exposed to the front face, said elongate slot being defined along a direction in which the insulative housing extends;

power contact pairs received within the housing, each of said power contact pairs including a pair of transversely aligned bodies, a pair of engaging sections extending into the elongate slot and a pair of tail sections extending beyond the rear face, said pair of tail sections being transversely deflected toward each other to define a relatively small distance therebetween for sandwiching a capacitor board therein; and signal contacts received within the housing adjacent to and transversely aligned with the corresponding power contact pairs, respectively, wherein the signal contacts are positioned on one lateral side of the housing while said power contact pairs are positioned on the other lateral side of the housing, oppositely.

13. The power connector as claimed in claim 1, wherein the engaging sections of the hot terminals and free ends of the engaging sections of the signal contacts lie in a common plane.

* * * * *